(12) United States Patent
Shin

(10) Patent No.: US 6,234,692 B1
(45) Date of Patent: May 22, 2001

(54) SEMICONDUCTOR DEVICE FABRICATING APPARATUS WITH A COVER OVER THE WAFER SURFACE

(75) Inventor: Ji-hyoun Shin, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/311,727

(22) Filed: May 14, 1999

(30) Foreign Application Priority Data

Jun. 11, 1998 (KR) .................................................. 98-21801

(51) Int. Cl.[7] ....................................................... G03D 5/00
(52) U.S. Cl. ........................... 396/604; 396/611; 396/627; 118/52; 427/240
(58) Field of Search ..................................... 396/604, 611, 396/627; 118/50, 52, 320, 325, 666, 667, 712; 134/902; 427/240

(56) References Cited

U.S. PATENT DOCUMENTS

| | | | |
|---|---|---|---|
| 4,889,069 | * 12/1989 | Kawakami | ............................. 118/52 |
| 5,439,519 | * 8/1995 | Sago et al. | ............................. 118/52 |
| 5,591,264 | * 1/1997 | Sugimoto et al. | ................... 118/320 |
| 5,772,764 | * 6/1998 | Akimoto | ................................. 118/52 |

* cited by examiner

Primary Examiner—D. Rutledge
(74) Attorney, Agent, or Firm—Jones Volentine, LLC

(57) ABSTRACT

An apparatus for fabricating semiconductor devices includes a spin chuck configured for mounting a wafer thereon and operative to rotate the wafer. A nozzle is arranged above the spin chuck, through which a solution is supplied to a surface of the wafer mounted on the spin chuck. A bowl surrounds the spin chuck to prevent the solution from reaching an inner wall of a process chamber. A cover is spaced apart from and confronts the spin chuck having the wafer mounted thereon. The cover has an opening through which a distal end of the nozzle passes so as to spray the solution onto the wafer surface while the cover is disposed over the wafer surface. The cover prevents any solution reflected back from the bowl from reaching the wafer surface.

10 Claims, 3 Drawing Sheets

SEMICONDUCTOR DEVICE FABRICATING APPARATUS WITH A COVER OVER THE WAFER SURFACE

BACKGROUND OF THE INVENTION

1. Field of the Invention

The present invention relates to improved apparatus for fabricating semiconductor devices having a nozzle and a spin chuck, and more particularly, to an apparatus with a cover, spaced apart from and confronting the wafer surface, for protecting wafers from solutions used to fabricate the semiconductor devices.

2. Description of the Related Art

Generally, semiconductor devices are created by depositing various insulating or metallic layers on a semiconductor wafer to form a multiple layer structure. Desired circuit patterns are formed on the layers according to the properties of the respective semiconductor devices.

The circuit patterns are formed by photolithography processes, which generally comprise coating a photoresist on the wafer, aligning a photo mask having the circuit pattern formed thereon with the wafer, and then exposing selected areas of the photoresist consistent with the pattern. The exposed portion of the photoresist is removed using a developing solution so as to form a photoresist pattern. Thereafter, an etching process is performed using the photoresist pattern as an etching mask to thereby form the desired circuit pattern.

During the photolithography process, specific solutions (e.g., solutions used in the semiconductor device fabrication process or developing solutions) are sprayed onto the substrate using a nozzle and a spin chuck as shown in FIG. 1. The spin chuck 12 secures the wafer W thereon, usually via vacuum suction, and rotates it at a specific speed. A specific solution 13 is sprayed through the nozzle 14 and onto the wafer W surface. More than one nozzle 14 may be provided, and the nozzle locations may be varied according to the process steps and operating conditions.

As the solution 13 is sprayed through the nozzle 14, the wafer W is rotated by rotating the spin chuck 12, so that the solution 13 is uniformly dispersed or coated along the entire wafer surface. However, as the solution 13 reaches the edge portion of the wafer W, it is scattered due to the centrifugal force of the rotating wafer W.

A bowl 18, provided inside a process chamber 16, surrounds the spin chuck 12, nozzle 14, and wafer W, to prevent the solution 13 supplied onto the wafer W from being scattered onto the inner wall of the process chamber 16. However, some of the solution 13 contacting the bowl 18 is undesirably reflected back onto the wafer W, as shown by the arrows in FIG. 1, which serves as a source for particle generation. The unwanted solution 13 reflected from the bowl 18 may cause pattern bridges and profile failures during the formation of the pattern. Such defects require the wafer W to be rejected or reworked, thereby resulting in a reduction in productivity.

To minimize the unwanted reflected solution, conventional procedures seek to precisely control the process parameters, such as the viscosity of the solution 13 or the rotation speed of the spin chuck 12. However, such process control parameters must take into account the desired parameters of the overall fabrication process, and as such, the process control ranges are limited.

SUMMARY OF THE INVENTION

The present invention is directed to an apparatus for fabricating semiconductor devices with a nozzle, a cover and a spin chuck that minimizes the occurrence of pattern formation failures during the semiconductor device fabrication process.

To achieve this and other advantages, and in accordance with the purpose of the present invention as embodied and broadly described, the apparatus for fabricating semiconductor devices comprises a spin chuck configured for mounting a wafer thereon and operative to rotate the wafer. A nozzle is arranged above the spin chuck, through which a solution is supplied to a surface of the wafer mounted on the spin chuck. A bowl surrounds the spin chuck, the bowl have a width greater than a diameter of the wafer mounted to the spin chuck, and a height greater than a combined height of the wafer mounted to the spin chuck. A cover is spaced apart from and confronts the spin chuck having the wafer mounted thereon. The cover has an opening through which a distal end of the nozzle passes so as to spray the solution onto the wafer surface while the cover is disposed over the wafer surface. The cover prevents any solution reflected back from the bowl from reaching the wafer surface.

The spin chuck and wafer cover may each be capable of vertical movement. The cover is preferably spaced 2 mm to 3 mm from the wafer surface.

If a plurality of nozzles are employed, the cover would have a corresponding plurality of openings to accommodate the nozzles passing there through. One or more of the openings may be radially elongated, thereby forming a slot in the cover, so that the nozzle may move back and forth in the radial direction along the slot.

It is to be understood that both the foregoing general description and the following detailed description are exemplary and explanatory and are intended to provide further explanation of the invention as claimed.

DETAILED DESCRIPTION OF THE PREFERRED EMBODIMENTS

Preferred embodiments of the present invention will now be described in detail with reference to the accompanying drawings.

Figure 1:
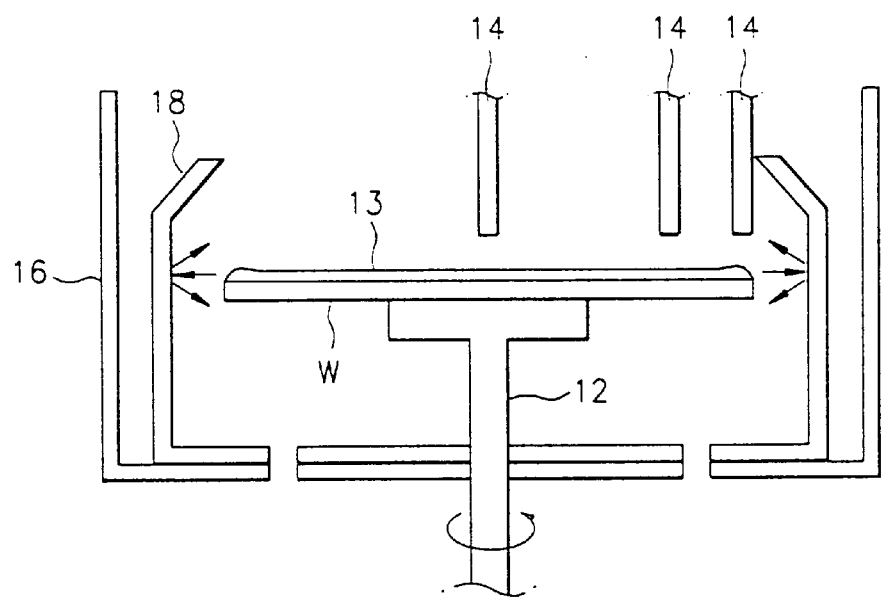
FIG. 1 is a side view of a conventional apparatus for fabricating semiconductor devices with a nozzle and a spin chuck.
Figure 2:
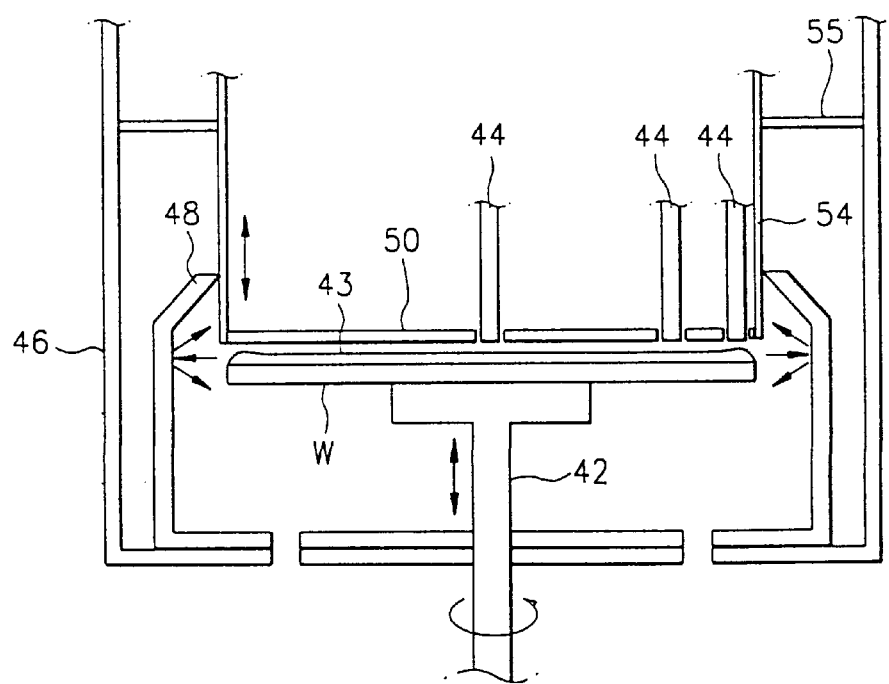
FIG. 2 and FIG. 3 are side views of an apparatus for fabricating semiconductor devices with a cover over the wafer surface according to embodiments of the present invention.

Referring to FIG. 2, there are provided a spin chuck 42, which is capable of rotating a wafer W mounted thereon at a certain speed. The wafer W is typically secured to the spin chuck 42 via vacuum suction. A nozzle 44 is positioned above the spin chuck 42. One end of the nozzle 44 is connected to a source of solution 43 (e.g., photoresist, a developing solution, a thinner, etc.) used in manufacturing semiconductor devices. The particular solution 43 is sprayed through the distal end of the nozzle 44 and onto the wafer W mounted on the spin chuck 42. The spin chuck 42 rotates the wafer W as the nozzle 44 sprays the solution 43 onto the wafer surface. The spin chuck 42 may be constructed such that it moves up/down with respect to the orientation shown in FIG. 2, using any suitable means to effect the vertical movement.

In addition, the nozzle 44 may be constructed such that it may be moved up/down or right/left, with respect to the orientation shown in FIG. 2, such that the nozzle 44 may be directed to a specific location on the wafer W. If one nozzle 44 is employed, it would have the capability of being connected to various source of solution 43 (e.g., photoresist, a developing solution, a thinner, etc.).

Alternatively, if a plurality of nozzles 44 are employed, each nozzle 44 could be connected to a different source of solution 43, and each nozzle 44 would be capable of moving up/down or right/left, with respect to the orientation shown in FIG. 2, using any suitable means to effect the vertical and horizontal movement.

For example, in an apparatus for fabricating semiconductor devices having three nozzles 44, two nozzles 44 would be positioned over the wafer W to spray photoresist thereon, and one nozzle 44 would be positioned in close proximity to the circumferential edge of the wafer W for spraying a rinsing solution, such as thinner, to rinse the peripheral portion of the wafer W after the spraying of the photoresist.

As shown in FIG. 2, a bowl 48 surrounds the spin chuck 42 and wafer W mounted thereon. Note that the bowl 48 has a width greater than a diameter of the wafer W mounted on the spin chuck 42, and a height greater than a combined height of the wafer W mounted on the spin chuck 42. This configuration prevents the solution 43 that is sprayed onto the wafer W from being scattered toward the inner wall of the process chamber 46.

The bowl 48 may be comprised of various shapes, for example, tubular, cylindrical, or square shaped. In the embodiment shown in FIG. 2, the upper ends of the bowl 48 are inclined inwardly toward the central vertical axis of the wafer W to further prevent solution 43 from being scattered toward the inner wall of the process chamber 46.

In order to protect the wafer W from any solution 43 that is reflected back from the inner wall of the bowl 48 (see arrows in FIG. 2), a cover 50 is provided over the wafer W mounted on the spin chuck 42. In other words, the cover 50 is spaced apart from and confronts the wafer surface. The distance between the cover 50 and the wafer W mounted on the spin chuck 42 is determined with reference to the final thickness of the solution 43 sprayed on the wafer W. Preferably, the distance is between about 2 mm to 3 mm. Of course, distances of less than 2 mm or greater than 3 mm are contemplated within the scope of this invention.

Preferably, the cover 50 is constructed so as to be movable up/down with respect to the orientation shown in FIG. 2 so as to facilitate efficient loading of the wafer W on the spin chuck 42. Such up/down movement of the cover 50 can be achieved using any suitable moving apparatus, such as a lifter. Alternatively, if a robot arm is used, the cover 50 may be moved up/down as well as right/left.

The various locations of the moving apparatus, for example, inside the process chamber 46 or the outside thereof, the particular moving apparatus itself, and the range or degree of movement for the cover 50, are variations that can be made by one of ordinary skill in the art within the scope of the present invention.

As shown in FIG. 2, the cover 50 is attached to the side to the of the process chamber 46, using a fixed member 55 connected to a fixing device 54. Any suitable means of providing an attachment between the cover 50 and the process chamber 46 may be utilized. Preferably, the attachment means would include a slide mechanism to allow the cover 50 to be moved up/down.

Figure 3:
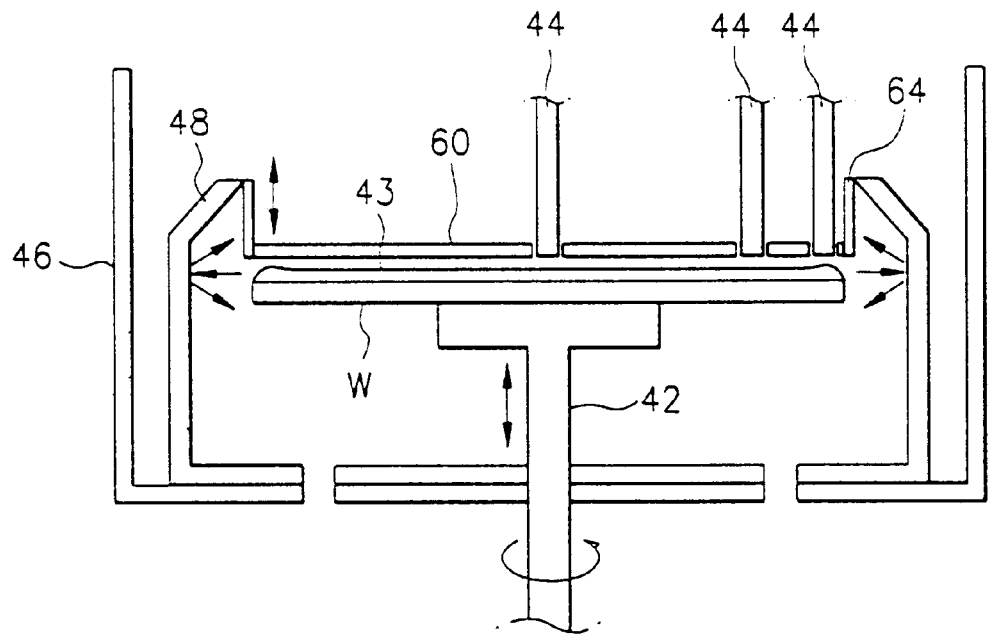

FIG. 3 depicts an alternate embodiment, wherein the cover 60 is attached to the upper end of the bowl 48 via a fixing device 64. As with the embodiment of FIG. 2, any suitable means of providing an attachment between the cover 60 and the bowl 48 may be utilized. Preferably, the attachment means would include a slide mechanism to allow the cover 60 to be moved up/down. The same reference numerals in FIG. 3 refer to the like elements in FIG. 2, and the discussion of these elements is thus omitted as redundant.

The cover 50, 60 of the present invention can be installed in various manners based on the diameter of the wafer W mounted on the spin chuck 42, and as in the embodiment of the present invention, the cover 50, 60 may have the same diameter as that of the wafer W or slightly larger.

Figure 4:
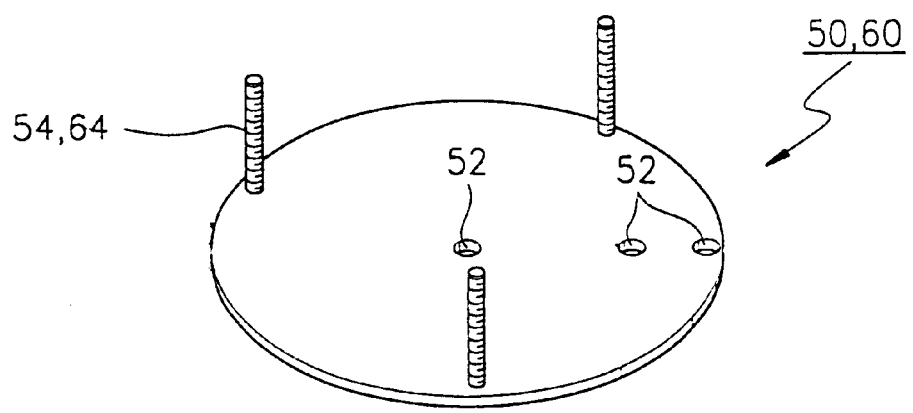
FIG. 4 is a perspective view of the cover according to the present invention.

As shown in FIG. 4, the cover 50, 60 has openings 52 formed therein so that the distal end of the nozzle(s) 44 may pass there through to supply the solution 43 to the surface of the wafer W with the cover 50, 60 installed. The number of openings 52 preferably corresponds to the number of nozzles 44 employed in the various process steps. Note also that the openings 52 are radially spaced along the cover 50, 60 to correspond to the spacing of the nozzles 44 over the wafer W. FIG. 4 also depicts the fixing means 54, 64 for attaching the cover 50, 60 to the process chamber 46 or bowl 48, respectively.

Figure 5:
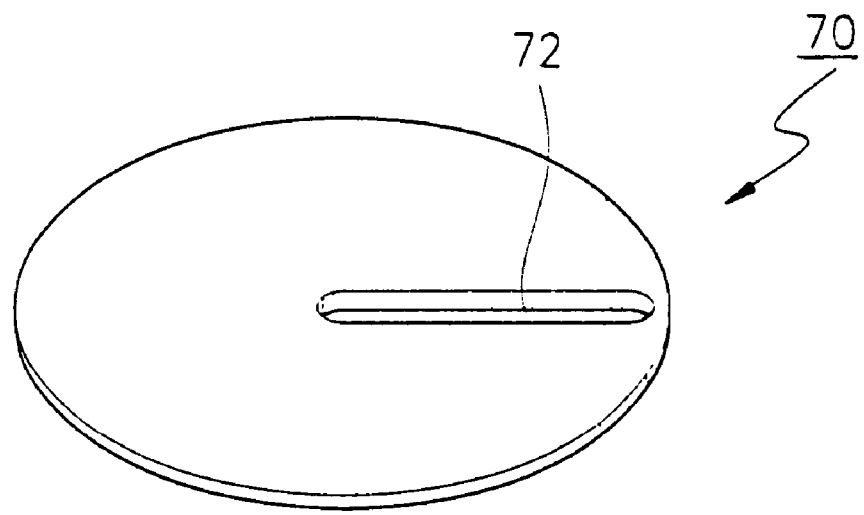
FIG. 5 is a perspective view of the cover according to another embodiment of the present invention.

FIG. 5 depicts another embodiment of the present invention in which a radially elongated slot 72 is formed in the cover 70. With such a configuration, a nozzle 44 may be moved horizontally along the surface of the wafer W as it sprays a solution 43 onto the wafer surface. Similar fixing devices 54, 64 as shown in FIGS. 2–4 may be used to attached the cover 70 to either the process chamber 46 or bowl 48. One or more of the slots 72 may be incorporated in the cover 50, 60 of FIG. 4.

The apparatus of the present invention having the cover 50, 60, 70 can be employed in wide variety of semiconductor device fabricating equipment, including equipment for coating photoresist on a wafer W, for spraying a developing solution onto a wafer W, and for spraying a rinsing solution, such as thinner, onto the wafer W. The cover 50, 60, 70 is preferably made of transparent material in order to effectively check the solution 43 spraying operations, and to facilitate cleaning of any scattered solution 43. For example, a transparent chemically-resistant material, such as TEFLON™ (DuPont Co.), can be used because it will withstand not only the solutions 43, but the cleaning solutions used to remove the solutions 43 adhered to the cover 50, 60, 70.

Therefore, according to the present invention, the cover 50, 60, 70 prevents any solution 43 reflected back from the bowl 48 from reaching the surface of the wafer W. Accordingly, a source of particle contamination is eliminated, and the occurrence of pattern bridges and profile failures during the formation of the pattern is reduced or eliminated, thereby increasing productivity since there are fewer wafers that are rejected or that need to be reworked.

Note also that the process failures are reduced, and productivity is increased, by the alteration of the physical structure of the apparatus, not by the control of the process conditions, or parameters, such as the viscosity of the solution 43 or the rotation speed of the spin chuck 42.

While the present invention has been described in detail, it should be understood that various changes, substitutions and alterations can be made hereto without departing from the spirit and scope of the invention as defined by the appended claims.

What is claimed is:

1. The apparatus for fabricating semiconductor devices, comprising:
    a spin chuck configured for mounting a wafer thereon and operative to rotate the wafer;
    a nozzle arranged above the spin chuck, through which a solution is supplied to a surface of the wafer mounted on the spin chuck;
    a bowl surrounding the spin chuck, the bowl have a width greater than a diameter of the wafer mounted to the spin chuck, and a height greater than a combined height of the wafer mounted to the spin chuck;
    a cover spaced apart from and confronting the spin chuck having the wafer mounted thereon, the cover having an opening through which a distal end of the nozzle passes; and
    a process chamber surrounding the bowl;
    wherein the cover is spaced about 2 mm to 3 mm from the spin chuck having the wafer mounted therein.

2. The apparatus for fabricating semiconductor devices of claim 1, further comprising means for moving the spin chuck vertically with reference to a central axis of the wafer rotating on the spin chuck.

3. The apparatus for fabricating semiconductor devices of claim 1, further comprising means for moving the cover vertically with reference to a central axis of the wafer rotating on the spin chuck.

4. The apparatus for fabricating semiconductor devices of claim 3, wherein the cover is slidably attached to a portion of an inner wall of the bowl.

5. The apparatus for fabricating semiconductor devices of claim 3, wherein the cover is slidably attached to a portion of an inner wall of the process chamber.

6. The apparatus for fabricating semiconductor devices of claim 1, wherein a diameter of the cover is greater than the diameter of the wafer.

7. The apparatus for fabricating semiconductor devices of claim 1, wherein the solution is photoresist.

8. The apparatus for fabricating semiconductor devices, comprising:
    a spin chuck configured for mounting a wafer thereon and operative to rotate the wafer;
    a nozzle arranged above the spin chuck, through which a solution is supplied to a surface of the wafer mounted on the spin chuck;
    a bowl surrounding the spin chuck, the bowl have a width greater than a diameter of the wafer mounted to the spin chuck, and a height greater than a combined height of the wafer mounted to the spin chuck;
    a cover spaced apart from and confronting the spin chuck having the wafer mounted thereon, the cover having an opening through which a distal end of the nozzle passes; and
    a process chamber surrounding the bowl;
    wherein a diameter of the cover is equal to the diameter of the wafer.

9. The apparatus for fabricating semiconductor devices, comprising:
    a spin chuck configured for mounting a wafer thereon and operative to rotate the wafer;
    a nozzle arranged above the spin chuck, through which a solution is supplied to a surface of the wafer mounted on the spin chuck;
    a bowl surrounding the spin chuck, the bowl have a width greater than a diameter of the wafer mounted to the spin chuck, and a height greater than a combined height of the wafer mounted to the spin chuck;
    a cover spaced apart from and confronting the spin chuck having the wafer mounted thereon, the cover having an opening through which a distal end of the nozzle passes; and
    a process chamber surrounding the bowl;
    wherein the opening in the cover comprises a radially elongated slot, and wherein the nozzle radially reciprocates back and forth in a radial direction over the wafer within the radially elongated slot.

10. An apparatus for fabricating semiconductor devices comprising:
    a spin chuck configured for mounting a wafer thereon and operative to rotate the wafer;
    a bowl surrounding the spin chuck, the bowl have a width greater than a diameter of the wafer mounted to the spin chuck, and a height greater than a combined height of the wafer mounted to the spin chuck;
    a plurality of nozzles arranged above the spin chuck, through which various solutions are supplied to the surface of the wafer mounted on the spin chuck;
    a cover spaced apart from and confronting the spin chuck having the wafer mounted thereon, the cover having at least one opening through which a distal end of each of the nozzles passes;
    a process chamber surrounding the bowl; and
    wherein said at least one opening includes a radially elongate slot opening, and wherein at least one of the nozzles reciprocates back and forth in a radial direction over the wafer within the radially elongated slot.

* * * * *